United States Patent
Tripathi et al.

(10) Patent No.: US 10,153,754 B2
(45) Date of Patent: Dec. 11, 2018

(54) METHOD FOR MANAGING THE OPERATION OF A LOW-COMPLEXITY SYNCHRONOUS RETENTION FLIP-FLOP CIRCUIT, AND CORRESPONDING CIRCUIT

(71) Applicants: STMicroelectronics International N.V., Schiphol (NL); STMicroelectronics SA, Montrouge (FR)

(72) Inventors: Alok Kumar Tripathi, Ghaziabad (IN); Amit Verma, Sadhaura (IN); Pascal Urard, Theys (FR)

(73) Assignees: STMicroelectronics International N.V., Schiphol (NL); STMicroelectronics SA, Montrouge (FR)

( * ) Notice: Subject to any disclaimer, the term of this patent is extended or adjusted under 35 U.S.C. 154(b) by 0 days.

(21) Appl. No.: 15/460,520

(22) Filed: Mar. 16, 2017

(65) Prior Publication Data

US 2018/0083602 A1 Mar. 22, 2018

(30) Foreign Application Priority Data

Sep. 19, 2016 (FR) .................... 16 58755

(51) Int. Cl.
*H03K 3/012* (2006.01)
*H03K 3/356* (2006.01)
(Continued)

(52) U.S. Cl.
CPC ....... *H03K 3/356104* (2013.01); *H03K 3/012* (2013.01); *H03K 3/35625* (2013.01); *H03K 19/0002* (2013.01)

(58) Field of Classification Search
CPC ............. H03K 3/012; H03K 3/356104; H03K 19/0002
(Continued)

(56) References Cited

U.S. PATENT DOCUMENTS 6,437,623 B1 * 8/2002 Hsu ...................... G01R 31/319
327/202
6,597,620 B1 7/2003 McMinn
(Continued)

FOREIGN PATENT DOCUMENTS

WO WO-2007135487 A1 11/2007

OTHER PUBLICATIONS

INPI Search Report and Written Opinion for FR 1658755 dated Jul. 14, 2017 (14 pages).

*Primary Examiner* — William Hernandez
(74) *Attorney, Agent, or Firm* — Crowe & Dunlevy

(57) ABSTRACT

A synchronous retention flip-flop circuit includes a first circuit module powered by an interruptible power source and a second circuit module powered by a permanent power source. The first circuit module includes a first latch circuit and a second latch circuit which are configured to store at least one datum while the interruptible power source is supplying power. A transmission circuit operates to deliver the at least one datum to the second circuit module before an interruption of the interruptible power source. The second circuit module preserves the at least one datum during the interruption. Following an end of the interruption, a restoring circuit transfers the at least one datum from the second circuit module to the first circuit module via a single one of the first and second latch circuits.

22 Claims, 2 Drawing Sheets

(51) Int. Cl.
*H03K 19/00* (2006.01)
*H03K 3/3562* (2006.01)

(58) Field of Classification Search
USPC ....... 327/202, 203, 208, 210, 211, 212, 214, 327/215, 218, 225
See application file for complete search history.

(56) References Cited

U.S. PATENT DOCUMENTS

| | | |
|---|---|---|
| 8,407,540 B2* | 3/2013 | Chandra ........ G01R 31/318357 327/202 |
| 2004/0090256 A1* | 5/2004 | Cho ................. H03K 3/356008 327/202 |
| 2006/0220717 A1 | 10/2006 | Padhye et al. |
| 2007/0085585 A1 | 4/2007 | Frederick |
| 2008/0056049 A1 | 3/2008 | Moyer et al. |
| 2009/0058484 A1 | 3/2009 | Rao et al. |
| 2009/0066385 A1 | 3/2009 | Hoover |
| 2010/0001774 A1* | 1/2010 | Djaja ..................... H03K 3/012 327/202 |
| 2016/0065188 A1 | 3/2016 | Singhal |
| 2017/0012611 A1* | 1/2017 | Escobar ............... H03K 3/0372 |
| 2018/0083603 A1* | 3/2018 | Urard ................ H03K 19/0002 |

* cited by examiner

METHOD FOR MANAGING THE OPERATION OF A LOW-COMPLEXITY SYNCHRONOUS RETENTION FLIP-FLOP CIRCUIT, AND CORRESPONDING CIRCUIT

PRIORITY CLAIM

This application claims the priority benefit of French Application for Patent No. 1658755, filed on Sep. 19, 2016, the disclosure of which is hereby incorporated by reference in its entirety to the maximum extent allowable by law.

TECHNICAL FIELD

Implementation and embodiments relate to sequential logic circuits and more particularly to synchronous retention flip-flop circuits (i.e., circuits configured to be capable of preserving, when power is cut to most of said synchronous retention flip-flop circuits, stored data using a small portion of said circuits which are suitable for being powered permanently).

BACKGROUND

In particular because in integrated circuits transistor size continues to decrease under the 100 nm bar by virtue of the advance of technologies such as the CMOS SOI technology, the power consumption associated with static leakage currents is becoming increasingly significant with respect to overall integrated-circuit consumption.

A plurality of techniques, such as power source switching and the use of transistors having a plurality of threshold voltages, commonly called multi-threshold CMOS (MTC-MOS) transistors in the art, have been adopted to decrease the consumption associated with static leakage current.

However, these techniques could not preserve data, for example during an integrated-circuit power-source interruption.

Under these circumstances, synchronous retention flip-flop circuits are generally used in order not only to decrease the consumption due to static leakage currents, but also to prevent the loss of stored data.

Conventionally, such a synchronous retention flip-flop circuit uses, during a phase of restoring data, at the end of a phase of retaining data, two storage stages, for example two latch stages that operate alternatively and successively on one of the two (low/high) states of one or more clock signals.

However, a solution with two storage stages generally requires the one or more clock signals and the associated control signals to be routed over very complex pathways. Sometimes such solutions require additional routing via the top metallization levels of the integrated circuit, this multiplying the complexity of the design of this type of synchronous flip-flop circuit.

There is accordingly a need in the art to provide a low-complexity technical solution that uses a small silicon area to make designing synchronous retention flip-flop circuits easier, especially with respect to the routing of the clock and control signals.

SUMMARY

According to one aspect, a method is provided for managing the operation of a synchronous retention flip-flop circuit comprising a first circuit module suitable for being powered by an interruptible power source (i.e., a power source that is suitable for being interrupted) and including a first latch circuit and a second latch circuit, and a second circuit module suitable for being powered by a permanent power source. The method includes: storing at least one datum in the first and second latch circuits while said interruptible power source is supplying power; delivering said at least one datum to the second circuit module before an interruption, or cut-out, of the interruptible supply source; retaining said at least one datum in the second circuit module during said interruption; and restoring said at least one datum to the first circuit module at the end of the interruption.

The restoration of said at least one datum is performed via a single one of the two latch circuits and is controlled by a first control signal and an internal clock signal itself controlled by the first control signal. The internal clock signal remains constant during the restoral.

The fact that during the restoration the datum is routed via a single of the two latch circuits allows, in combination with the use of an internal clock signal controlled by the first control signal, the routing of the first control signal and of the internal clock signal to be simplified, thereby decreasing the number of metallization levels used.

Such a method for managing the operation of a synchronous conversion flip-flop also advantageously makes it possible to be sure that the pathway will be routed via a single latch circuit during the data-restoring phase, by virtue of the set (constant) state of the internal clock signal during this restoring phase.

According to another aspect, a synchronous retention flip-flop circuit is provided. This circuit comprises: a first circuit module suitable for being powered by an interruptible power source and a second circuit module suitable for being powered by a permanent power source.

The first circuit module includes: a first controlling circuit configured to deliver a first control signal, a clock circuit configured to generate an internal clock signal from the first control signal, a first latch circuit and a second latch circuit that are configured to store at least one datum while said interruptible power source is supplying power, a transmitting circuit suitable for being controlled and configured to deliver said at least one datum to the second circuit module before an interruption of said interruptible power source, the second circuit module being configured to preserve said at least one datum during said interruption, and a restoring circuit suitable for being controlled by the first control signal and by the internal clock signal and which is configured to allow said at least one datum to be restored via a single of the two latch circuits.

The clock circuit is configured to maintain the internal clock signal constant during said restoration.

According to one embodiment, the first circuit module comprises a first transmission circuit suitable for being controlled by the internal clock signal and coupling the second latch circuit to the first latch circuit.

The transmitting circuit includes a second transmission circuit that is coupled between the second latch circuit and the second circuit module.

The restoring circuit includes the first transmission circuit and a third transmission circuit that is suitable for being controlled by the first control signal and that is coupled between the first latch circuit and the second circuit module.

The first transmission circuit may be suitable for being controlled by the internal clock signal and may be configured to be in an on state only when the internal clock signal possesses a first value.

The second latch circuit may be suitable for being controlled by the internal clock signal and may be configured to store said at least one datum only when the internal clock signal possesses a second value that is complementary to the first value.

By way of non-limiting example, the first latch circuit may include a first tri-state inverter suitable for being controlled by the internal clock signal and the first control signal.

The second circuit module may include a second controlling circuit configured to deliver a second control signal.

The second transmission circuit may include a second tri-state inverter suitable for being controlled by the second control signal.

The third transmission circuit may include a third tri-state inverter suitable for being controlled by the first control signal.

According to another embodiment, the second circuit module includes a third latch circuit coupled to the first circuit module, suitable for being controlled by the second control signal and configured to preserve said at least one datum.

The third latch circuit may for example include a fourth tri-state inverter suitable for being controlled by the second control signal.

According to another embodiment, the second circuit module and the second transmission circuit may include transistors of ultra-high threshold voltage so as to decrease the consumption associated with leakage currents.

A transistor of ultra-high threshold voltage generally has a high doping density in the substrate/channel region so as to obtain an ultra-low leakage current when this transistor is in the off state. The threshold voltage of such a transistor may vary depending on the technology used; for example, in a 40 nm technology, the threshold voltage of such a transistor may vary between 0.4 and 0.5 V.

According to another aspect, a system is provided including at least one circuit such as defined above.

According to yet another aspect, an electronic apparatus, such as a mobile cell phone, tablet, or laptop computer, is proposed, comprising at least one system such as defined above is provided.

BRIEF DESCRIPTION OF THE DRAWINGS

Other advantages and features of the invention will become apparent on examining the detailed description of wholly non-limiting implementations and embodiments and the appended drawings in which.

DETAILED DESCRIPTION

Figure 1:
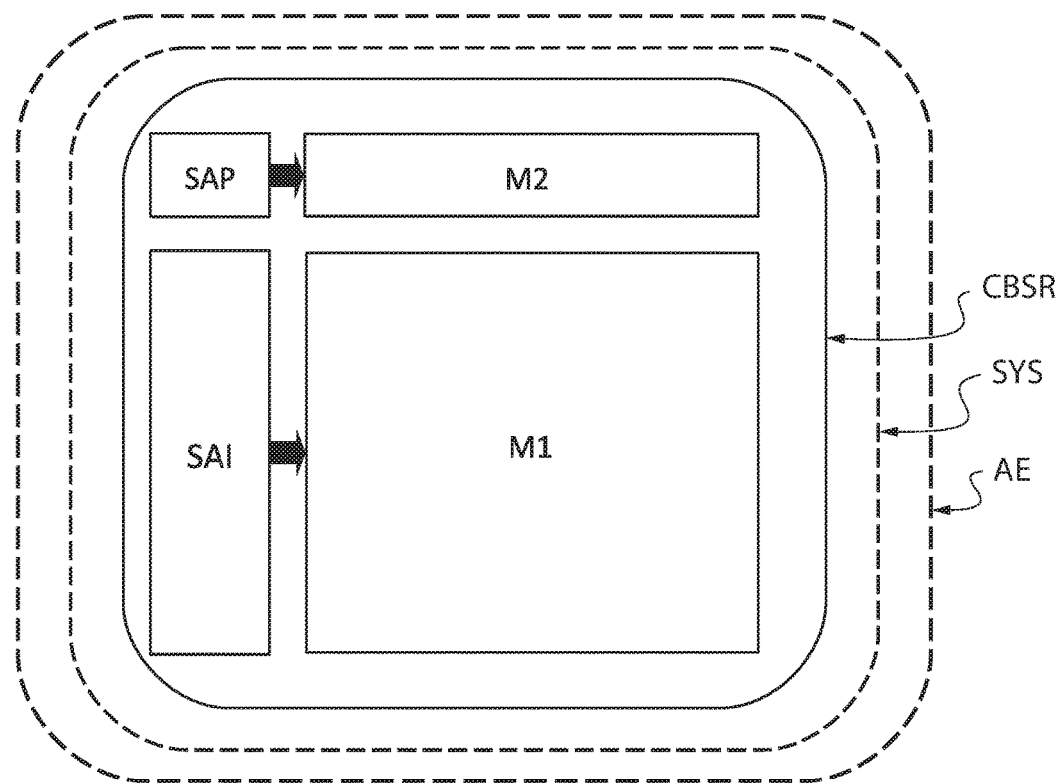
FIG. 1 schematically illustrates an electronic apparatus comprising a processing system with a system of shift registers including a synchronous retention flip-flop circuit.

FIG. 1 schematically illustrates an electronic apparatus AE, for example a mobile cell phone, comprising a processing system SYS, here for example a system of shift registers, itself including a synchronous flip-flop circuit such as what is called a synchronous retention flip-flop circuit CBSR.

The synchronous retention flip-flop circuit CBSR comprises a first circuit module M1 that is suitable for being powered by an interruptible power source SAI (i.e., a power source that is able to be interrupted) and a second circuit module M2 that is suitable for being powered by a permanent power source SAP.

Functionally, the synchronous flip-flop circuit CBSR is configured to: store in the first circuit module M1 at least one datum that it is desired to preserve, deliver said at least one datum to the second circuit module M2, which is always suitable for being powered before an interruption of the interruptible power source SAI so as to decrease the overall consumption of the circuit CBSR, preserve said at least one datum in the second circuit module M2 during said interruption of the interruptible supply source SAT, and return to said first circuit module M1 said at least one datum and restore said at least one datum to the first circuit module M1 at the end of the interruption of the interruptible power supply SAI (i.e., during the recovery of the interruptible power source SAI).

Figure 2:
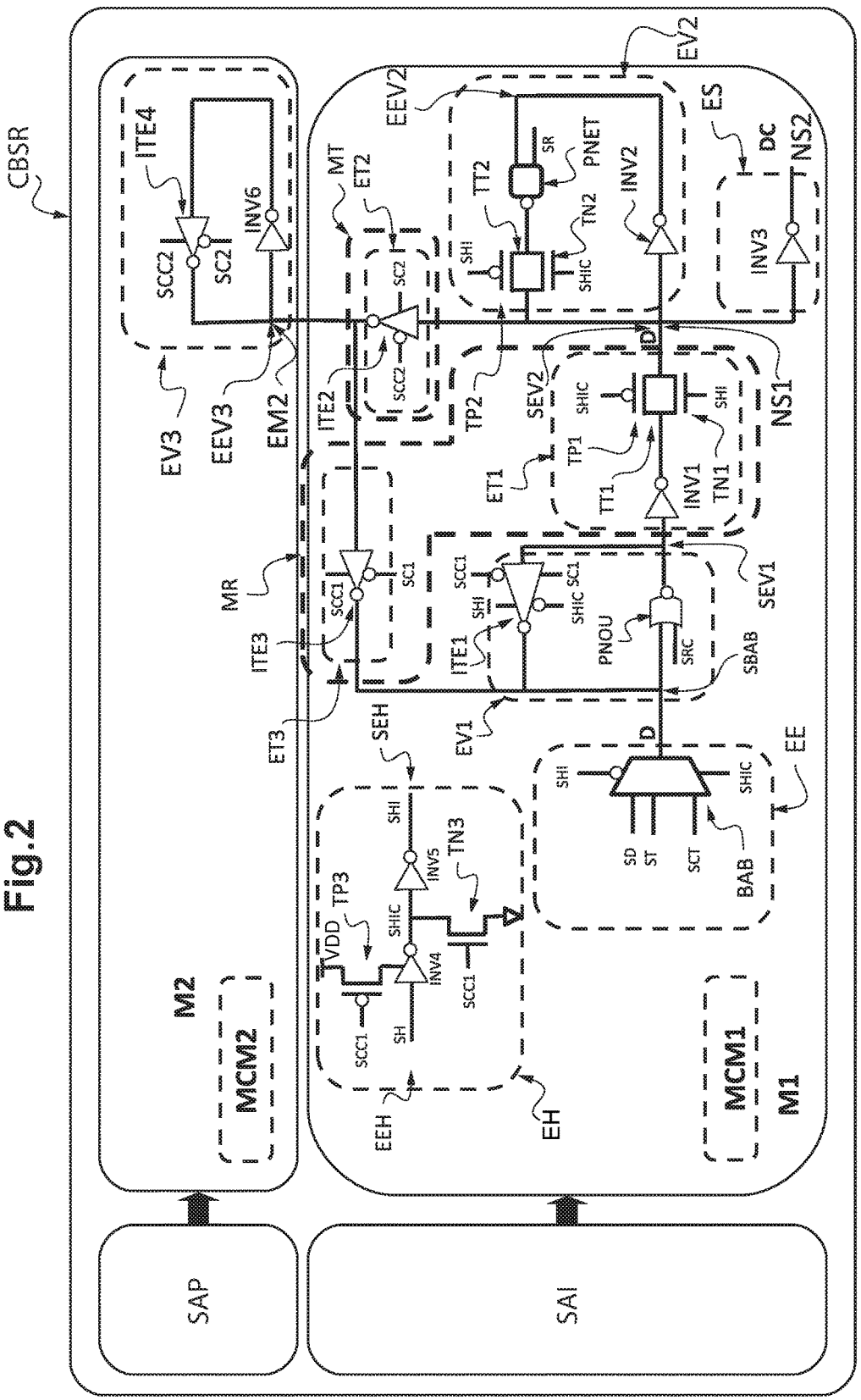
FIG. 2 schematically illustrates a synchronous retention flip-flop circuit.

Reference will now be made to FIG. 2 to schematically illustrate in more detail an exemplary structure of a synchronous retention flip-flop circuit. For the sake of simplicity, the illustrated example is a 1-bit synchronous flip-flop circuit.

As already illustrated in FIG. 1, the synchronous retention flip-flop circuit CBSR comprises a first circuit module M1 and a second circuit module M2 that are suitable for being powered by an interruptible power source SAI and a permanent power source SAP, respectively.

The first circuit module M1 comprises an input stage EE here including, for example, a synchronous scan flip-flop BAB that is intended to receive on its three inputs: a datum signal SD, a test signal ST, and a test control signal SCT.

The synchronous scan flip-flop BAB is clocked by an internal clock signal SHI and a complementary internal clock signal SHIC.

When the internal clock signal SHI is in the low state, the synchronous scan flip-flop BAB delivers to its output SBAB a datum D of the datum signal SD or of the test signal ST depending on the test control signal SCT.

More precisely, if the test control signal SCT is in its high state, the test signal ST is selected. Otherwise, the datum signal SD is delivered to the output SBAB of the synchronous scan flip-flop BAB.

When the internal clock signal SHI is in its high state, no signal is delivered by the synchronous scan flip-flop BAB.

The first circuit module M1 also includes a first storage circuit, here a first latch circuit EV1, and a first transmission circuit ET1, which are coupled in series between the output SBAB of the synchronous scan flip-flop BAB and a first output node NS1 of the first circuit module M1.

The first latch circuit EV1 includes a NOR logic gate PNOU and a first tri-state inverter ITE1 coupled back-to-back with the logic gate PNOU between the output SBAB of the synchronous scan flip-flop BAB and the output SEV1 of the first latch circuit.

The NOR logic gate PNOU includes: a first input coupled to the output SBAB of the synchronous scan flip-flop BAB, a second input intended to receive a complementary reset signal SRC, and an output coupled to the output SEV1 of the first latch circuit EV1.

The complementary reset signal SRC is configured to reset the state of the first latch circuit EV1 and is implemented by default in its low state so as to allow the NOR logic gate PNOU to function as a conventional inverter.

When the complementary reset signal SRC is set to the high state, the first latch circuit EV1 resets and delivers to its output SEV1 a low logic value ("0").

The first tri-state inverter ITE1 is simultaneously suitable for being controlled by the internal clock signal SHI, the complementary internal clock signal SHIC, a first control signal SC1 and a first complementary control signal SCC1.

The first tri-state inverter ITE1 functions as a conventional inverter only when the internal clock signal SHI and the first control signal SC1 are in the high state (the complementary internal clock signal SHIC and the first complementary control signal SCC1 then being in the low state).

In any other case, the first tri-state inverter ITE1 is in a high-impedance state and the first latch circuit EV1 simply becomes an inverter if the complementary reset signal SRC is in the low state.

The first transmission circuit ET1 includes a first inverter INV1 and a first pair of transmission transistors TT1, which are coupled in series between the output SEV1 of the first latch circuit EV1 and the first output node NS1 of the first circuit module M1.

The first pair of transmission transistors TT1 includes a first pMOS transistor TP1 and a first nMOS transistor TN1, which are coupled in parallel and suitable for being controlled by the complementary internal clock signal SHIC and the internal clock signal SHI, respectively.

The first pair of transmission transistors TT1 is turned on only when the internal clock signal SHI is in the high state and the complementary internal clock signal SHIC is in the low state.

In this case, the first transmission circuit ET1 functions as a conventional inverter so as to transmit to the first output node NS1 a datum D of the datum signal SD or of the test signal ST, which datum is stored in the first latch circuit EV1.

Otherwise, the first pair of transmission transistors TT1 is in the off state so as to cut the connection between the first latch circuit EV1 and the first output node NS1.

The first circuit module M1 also comprises a second latch circuit EV2 the output of which SEV2 is coupled to the first output node NS1. This second latch circuit EV2 includes: a second inverter INV2 coupled between the first output node NS1 and the input EEV2 of the second latch circuit EV2, a second pair of transmission transistors TT2, and a NAND logic gate PNET, which are coupled in series between the first output node NS1 and the input EEV2 of the second latch circuit EV2.

The NAND logic gate PNET has a first input coupled to the input EEV2 of the second latch circuit, a second input that is intended to receive a reset signal SR, and an output coupled to the second pair of transmission transistors TT2.

The reset signal SR always has a complemented value of the complementary reset signal SRC.

By default, the reset signal SR is set to the high state so as to allow the NAND logic gate PNET to function as a conventional inverter. When the reset signal SR is set to the low state, the NAND logic gate PNET delivers to its output a high logic value.

The second pair of transmission transistors TT2 includes a second pMOS transistor TP2 and a second nMOS transistor TN2, which are coupled in parallel and suitable for being controlled by the internal clock signal SHI and the complementary internal clock signal SHIC, respectively.

The second pair of transmission transistors TT2 is turned on only when the internal clock signal SHI is in the low state and the complementary internal clock signal SHIC is in the high state.

Therefore, if the first control signal SC1 and the reset signal SR are in the high state, the first and second latch circuits EV1 and EV2 alternatively and successively update, via the output node NS1, the datum stored in the first and second latch circuits EV1 and EV2, i.e. the datum D of the datum signal SD or of the test signal ST.

The first circuit module M1 also comprises an output stage ES coupled between the first output node NS1 and the second output node NS2. This output stage ES includes a third inverter INV3 intended to deliver a complemented value DC of the datum D stored in the first and second latch circuits EV1 and EV2.

The first circuit module M1 further comprises a transmitting circuit MT including a second transmission circuit ET2 that is coupled between the first output node NS1 and the input EM2 of the second circuit module, and a restoring circuit MR including the first transmission circuit ET1 and a third transmission circuit ET3 that is coupled between the output SBAB of the synchronous scan flip-flop BAB and the input EM2 of the second circuit module.

The second transmission circuit ET2 includes a second tri-state inverter ITE2 the input of which is coupled to the first output node NS1 and the output of which is coupled to the input EM2 of the second circuit module M2.

The second tri-state inverter ITET2 is suitable for being controlled by a second control signal SC2 and a second complementary control signal SCC2, and functions as a conventional inverter when the second control signal SC2 is in the high state and if the second complementary control signal SCC2 is in the low state.

The third transmission circuit ET3 includes a third tri-state inverter ITE3 the input of which is coupled to the input EM2 of the second circuit module and the output of which is coupled to the output SBAB of the synchronous scan flip-flop BAB.

The third transmission circuit ET3 is suitable for being controlled by a first control signal SC1 and a first complementary control signal SCC1, and functions as a conventional inverter when the first control signal SC1 is in its low state and the first complementary control signal SCC1 is in the high state.

The first circuit module M1 furthermore comprises a clock circuit EH that is configured to generate the internal clock signal SHI from the first control signal. This clock circuit EH includes: a fourth inverter INV4 and a fifth inverter INV5, which are coupled in series between the input EEH and the output SEH of the clock circuit, a third pMOS transistor TP3 the gate of which is coupled to the first complementary control signal SCC1, the source of which is coupled to the supply terminal of the fourth inverter INV4 and the drain of which is coupled to a power source VDD, and a third nMOS transistor TN3 the gate of which is coupled to the first complementary control signal SCC1, the drain is coupled between the fourth inverter INV4 and the fifth inverter INV5 and the source of which is coupled to ground GND.

The input EEH of the clock circuit EH is intended to receive a main clock signal SH. The complementary internal clock signal SHIC is generated at the output of the fourth inverter INV4 and the internal clock signal SHI is generated at the output of the fifth inverter INV5.

As the first complementary control signal SCC1 always has a complemented value of the value of the first control signal SC1, the clock circuit is also suitable for being controlled by the first control signal SC1.

When the first control signal SC1 is in the high state, the first complementary control signal SCC1 is in the low state.

Therefore, the third pMOS transistor TP3 and the third nMOS transistor TN3 are turned on and turned off, respectively.

In this case, the internal clock signal SHI follows the clock signal SH and the complementary internal clock signal possesses the complemented value of the value of the clock signal SH.

When the first control signal SC1 is in the low state, the first complementary control signal SCC1 is then in the high state. The third pMOS transistor TP3 and the third nMOS transistor TN3 are turned off and turned on, respectively.

Therefore, the fourth inverter INV4 is turned off. The value of the complementary internal clock signal SHIC is therefore independent of the value of the clock signal and is drawn to 0 by the third nMOS transistor TN3. The internal clock signal SHI is therefore in the high state.

Thus, the internal clock signal SHI and the complementary internal clock signal SHIC each remain in a constant (high and low) state when the first control signal SC1 is in the low state.

The second circuit module M2 includes a third latch circuit EV3 the input EEV3 of which is coupled to the output of the second transmission circuit ET2 and to the input of the first transmission circuit ET3.

The third latch circuit EV3 includes a sixth inverter INV6 and a fourth tri-state inverter ITE4, which are coupled back-to-back.

The fourth tri-state inverter ET4 is suitable for being controlled by the second control signal SC2 and the second complementary control signal SCC2, and functions as a conventional inverter when the second control signal SC2 is in its low state and the second complementary control signal SCC2 is in the high state.

Moreover, the second circuit module M2 and the second transmission circuit ET2 advantageously include transistors of ultra-high voltage threshold so as to obtain very low leakage currents especially during an interruption of the interruptible power source SAI.

Apart from the circuitry just described, the first and second circuit modules M1 and M2 respectively include controlling circuits MCM1 and MCM2, for example based on logic circuits, configured to deliver the first controlling signal SC1 and the second controlling signal SC2, respectively.

Figure 3:
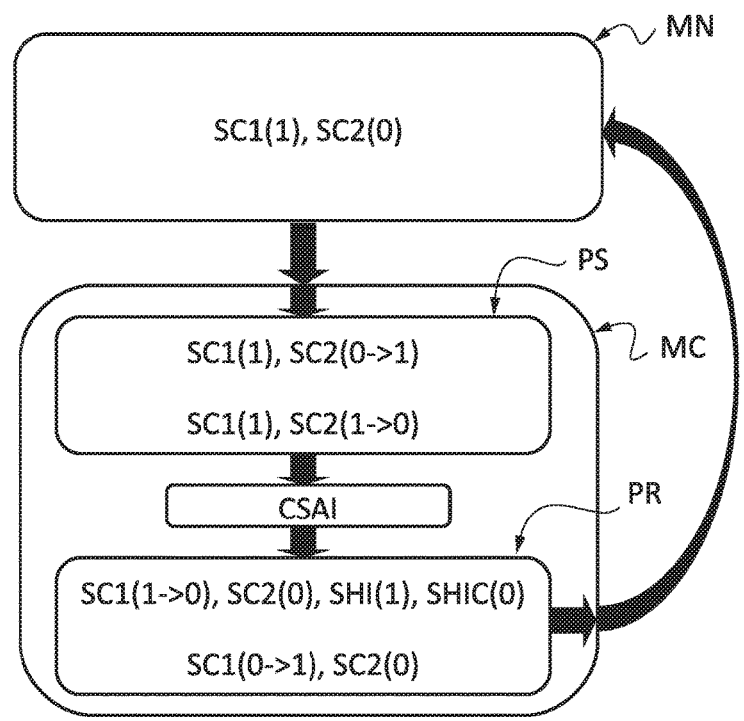
FIG. 3 illustrates various operations of the synchronous retention flip-flop circuit.

Reference will now be made to FIG. 3 to illustrate in more detail various operations of said synchronous flip-flop circuit CBSR.

The synchronous flip-flop circuit CBSR may function into operating modes: a normal mode MN and a retention mode MC.

In the normal mode MN, the first and second control signals SC1 and SC2 are configured to always be in the high state (1) and the low state (0), respectively.

Therefore, the second and third transmission circuits ET2 and ET3 are in the off state so as to disconnect the first and second circuit modules M1 and M2. The third pMOS transistor TP3 of the clock circuit is in the on state and the internal clock signal SHI and the complementary internal clock signal SHIC that depends on the clock signal SH are obtained.

The first and second latch circuits EV1 and EV2 alternatively and successively update the first output node NS1 with the datum D received via the input stage EE and stored in the first and second latch circuits EV1 and EV2. The complemented value DC of the datum is also obtained at the output of the first circuit module SM1.

The retention mode MC includes a backing-up phase PS and a restoring phase PR.

In the backing-up phase PS, the second control signal SC2 is set to the high state, thereby placing the second transmission circuit ET2 in the on state so as to deliver said datum D to the second circuit module M2.

The second control signal SC2 is again set to the low state at the end of the delivery of said datum D to turn on and off the second transmission circuit ET2 and the fourth tri-state inverter ITE4, respectively. Said datum is therefore transferred from the first circuit module M1 to the second circuit module M2.

In order to decrease the consumption of the circuit CBSR, the interruptible power source CSAI is interrupted at the end of this transfer so as to power down the first circuit module M1 that includes most of the transistors of said circuit CBSR.

As the second circuit module M2 is suitable for being powered by the permanent power supply SAP, the second circuit module M2 preserves in the third latch circuit EV3 said datum D during the interruption of the interruptible power supply CSAI.

The retaining phase PR starts at the end of said interruption CSAI. The first circuit module M1 is again suitable for being powered and the first control signal SC1 and the clock signals SHI, SHIC and SH are again operational.

The first control signal SC1 is set to the low state immediately at the end of the interruption CSAI so as to turn on the third transmission circuit ET3 and place the internal clock signal SHI and the complementary internal clock signal SHIC in the high state and low state, respectively.

Thus, the datum D preserved in the second circuit module M2 is sent back to the first latch circuit EV1 via the third transmission circuit ET3. The input stage EE is also turned off because the internal clock signal SHI is in the high state and the complementary internal clock signal SHIC is in the low state. The first transmission circuit ET1 is on, thereby allowing said datum D to be restored to the first output node NS1. Throughout the restoration, the internal clock signal SHI is maintained constant at the high logic value ("1").

The first control signal SC1 is again set to the high state at the end of the return of said datum D so as to again put the circuit CBSR into the normal mode MN.

Thus, a synchronous retention flip-flop circuit capable of restoring the datum D to the first output node NS1 via a single storage stage (here the first latch circuit EV1) and that is independent of clock signals during the restoring phase PR is obtained.

Such a synchronous retention flip-flop circuit advantageously allows complex routing, especially through top metallization levels (metallizations 2 and 3), of one or more control signals and of one or more clock signals to be avoided, and the number of transistors and the area of silicon used to be decreased.

The invention clamed is:

1. A synchronous retention flip-flop circuit, comprising:
    a first circuit module configured to be powered by an interruptible power source; and
    a second circuit module configured to be powered by a permanent power source and operable to preserve at least one datum during an interruption of power from the interruptible power source;
    wherein the first circuit module includes:
        a first controlling circuit configured to deliver a first control signal;
        a clock circuit configured to generate an internal clock signal from the first control signal;

a first latch circuit and a second latch circuit that are configured to store said at least one datum while said interruptible power source is supplying power, wherein the first latch circuit includes a first tri-state inverter controlled by the internal clock signal and the first control signal;
a transmitting circuit configured to deliver said at least one datum to the second circuit module for preservation before the interruption of power from said interruptible power source; and
a restoring circuit controlled by the first control signal and by the internal clock signal and configured to allow said at least one datum to be restored via a single one of the first and second latch circuits, wherein the restoring circuit includes a third transmission circuit having a third tri-state inverter controlled by the first control signal; and
wherein the clock circuit is configured to maintain a logic state of the internal clock signal constant during said restoration.

2. The flip-flop circuit according to claim 1, wherein the first circuit module comprises a first transmission circuit controlled by the internal clock signal and coupled between the second latch circuit and the first latch circuit, wherein the transmitting circuit includes a second transmission circuit coupled between the second latch circuit and the second circuit module, and wherein the restoring circuit includes the first transmission circuit and a third transmission circuit controlled by the first control signal and coupled between the first latch circuit and the second circuit module.

3. The flip-flop circuit according to claim 2, wherein the first transmission circuit is controlled by the internal clock signal and is configured to be in an on state only when the internal clock signal possesses a first value, and wherein the second latch circuit is controlled by the internal clock signal and configured to store said at least one datum only when the internal clock signal possesses a second value that is complementary to the first value.

4. The flip-flop circuit according to claim 2, wherein the second circuit module includes second controlling circuit that is configured to deliver a second control signal, and wherein the second transmission circuit includes a second tri-state inverter controlled by the second control signal.

5. The flip-flop circuit according to claim 4, wherein the second circuit module includes a third latch circuit coupled to the first circuit module, controlled by the second control signal and configured to preserve said at least one datum.

6. The flip-flop circuit according to claim 5, wherein the third latch circuit includes a fourth tri-state inverter controlled by the second control signal.

7. The flip-flop circuit according to claim 2, wherein the second circuit module and the second transmission circuit include transistors of ultra-high threshold voltage.

8. The flip-flop circuit of claim 1, wherein said flip-flop circuit is a component of a system.

9. The flip-flop circuit of claim 8, wherein said system is an electronic apparatus selected from the group consisting of: a mobile cell phone, a tablet, and a laptop computer.

10. A synchronous retention flip-flop circuit, comprising:
a first circuit module configured to be powered by an interruptible power source; and
a second circuit module configured to be powered by a permanent power source and operable to preserve at least one datum during an interruption of power from the interruptible power source;
wherein the first circuit module includes:

a clock circuit configured to generate an internal clock signal;
a first latch circuit and a second latch circuit that are configured to store said at least one datum in response to said internal clock signal while said interruptible power source is supplying power, wherein the first latch circuit includes a first tri-state inverter;
a first transmit circuit configured to transmit said at least one datum from the second latch circuit to the second circuit module before an interruption of power from the interruptible supply source, wherein the first transmit circuit includes a second tri-state inverter;
a second transmit circuit configured to transmit said at least one datum from the second circuit module to the first latch circuit when restoring said at least one datum in the first circuit module at the end of the interruption of power from the interruptible power source, wherein the second transmit circuit includes a third tri-state inverter; and
a third transmit circuit configured to transmit said at least one datum from the first latch circuit to the second latch circuit in response to said internal clock signal; and
wherein the clock circuit is configured to maintain a logic state of the internal clock signal constant during said restoration when said at least one datum is transmitted by said second transmit circuit from the second circuit module to the first latch circuit.

11. The flip-flop circuit of claim 10:
wherein the first circuit module further includes a first controlling circuit configured to deliver a first control signal for controlling tri-state configuration of the first and third tri-state inverters; and
wherein the second circuit module includes a second controlling circuit configured to deliver a second control signal for controlling tri-state configuration of the second tri-state inverter.

12. The flip-flop circuit of claim 11, wherein the second circuit module includes a third latch circuit coupled to the first circuit module, controlled by the second control signal and configured to preserve said at least one datum.

13. The flip-flop circuit of claim 12, wherein the third latch circuit includes a fourth tri-state inverter controlled by the second control signal.

14. The flip-flop circuit of claim 10, wherein said flip-flop circuit is a component of a system.

15. The flip-flop circuit of claim 14, wherein said system is an electronic apparatus selected from the group consisting of: a mobile cell phone, a tablet, and a laptop computer.

16. A synchronous retention flip-flop circuit, comprising:
a first circuit module configured to be powered by an interruptible power source; and
a second circuit module configured to be powered by a permanent power source and operable to preserve at least one datum during an interruption of power from the interruptible power source;
wherein the first circuit module includes:
a first controlling circuit configured to deliver a first control signal;
a clock circuit configured to generate an internal clock signal from the first control signal;
a first latch circuit and a second latch circuit that are configured to store said at least one datum while said interruptible power source is supplying power, wherein the first latch circuit includes a first tri-state inverter controlled by the internal clock signal and the first control signal;

a first transmission circuit controlled by the internal clock signal and coupled between the second latch circuit and the first latch circuit;

a transmitting circuit configured to deliver said at least one datum to the second circuit module for preservation before the interruption of power from said interruptible power source, wherein the transmitting circuit includes a second transmission circuit coupled between the second latch circuit and the second circuit module; and a restoring circuit controlled by the first control signal and by the internal clock signal and configured to allow said at least one datum to be restored via a single one of the first and second latch circuits, wherein the restoring circuit includes the first transmission circuit and a third transmission circuit controlled by the first control signal and coupled between the first latch circuit and the second circuit module, and wherein the third transmission circuit includes a third tri-state inverter controlled by the first control signal;

wherein the second circuit module includes:

a second controlling circuit that is configured to deliver a second control signal, and wherein the second transmission circuit includes a second tri-state inverter controlled by the second control signal; and wherein the clock circuit is configured to maintain a logic state of the internal clock signal constant during said restoration.

17. The flip-flop circuit according to claim 16, wherein the first transmission circuit is controlled by the internal clock signal and is configured to be in an on state only when the internal clock signal possesses a first value, and wherein the second latch circuit is controlled by the internal clock signal and configured to store said at least one datum only when the internal clock signal possesses a second value that is complementary to the first value.

18. The flip-flop circuit according to claim 16, wherein the second circuit module includes a third latch circuit coupled to the first circuit module, controlled by the second control signal and configured to preserve said at least one datum.

19. The flip-flop circuit according to claim 18, wherein the third latch circuit includes a fourth tri-state inverter controlled by the second control signal.

20. The flip-flop circuit according to claim 16, wherein the second circuit module and the second transmission circuit include transistors of ultra-high threshold voltage.

21. The flip-flop circuit of claim 16, wherein said flip-flop circuit is a component of a system.

22. The flip-flop circuit of claim 21, wherein said system is an electronic apparatus selected from the group consisting of: a mobile cell phone, a tablet, and a laptop computer.

* * * * *